United States Patent
La Rosa et al.

(10) Patent No.: US 9,012,961 B2
(45) Date of Patent: Apr. 21, 2015

(54) METHOD OF MANUFACTURING A NON-VOLATILE MEMORY

(71) Applicant: STMicroelectronics (Rousset) SAS, Rousset (FR)

(72) Inventors: Francesco La Rosa, Rousset (FR); Stephan Niel, Greasque (FR); Arnaud Regnier, Les Taillades (FR); Hélène Dalle-Houilliez, Saint-Maximin-la-Sainte-Baume (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 14/148,257

(22) Filed: Jan. 6, 2014

(65) Prior Publication Data

US 2014/0191291 A1 Jul. 10, 2014

(30) Foreign Application Priority Data

Jan. 7, 2013 (FR) ...................................... 13 50097

(51) Int. Cl.
*H01L 29/76* (2006.01)
*H01L 27/115* (2006.01)
*H01L 29/78* (2006.01)
*H01L 29/66* (2006.01)
*G11C 16/04* (2006.01)

(52) U.S. Cl.
CPC ...... *H01L 27/11556* (2013.01); *H01L 29/7827* (2013.01); *H01L 27/11524* (2013.01); *H01L 29/66666* (2013.01); *G11C 16/0433* (2013.01)

(58) Field of Classification Search
CPC ............ H01L 27/115; H01L 27/11524; H01L 27/11556; H01L 29/66666; H01L 29/7827; H01L 29/7397; H01L 29/66734
USPC .................................. 257/145, 242, 328–334
See application file for complete search history.

(56) References Cited

U.S. PATENT DOCUMENTS

| | | | |
|---|---|---|---|
| 8,940,595 B2 * | 1/2015 | Chandra et al. ............... | 438/197 |
| 2002/0153546 A1 * | 10/2002 | Verhaar ......................... | 257/296 |
| 2004/0173844 A1 | 9/2004 | Williams et al. | |
| 2006/0158930 A1 | 7/2006 | Thomas | |
| 2006/0170038 A1 * | 8/2006 | Wong et al. ................... | 257/330 |
| 2009/0251973 A1 * | 10/2009 | Satoh ......................... | 365/185.29 |
| 2013/0313637 A1 * | 11/2013 | Yoshida ......................... | 257/334 |
| 2014/0151757 A1 * | 6/2014 | Basu et al. ................... | 257/288 |
| 2014/0246720 A1 * | 9/2014 | Regnier et al. ................ | 257/336 |

* cited by examiner

*Primary Examiner* — Thanh T Nguyen
(74) *Attorney, Agent, or Firm* — Seed IP Law Group PLLC

(57) ABSTRACT

The disclosure relates to a method of manufacturing vertical gate transistors in a semiconductor substrate, comprising implanting, in the depth of the substrate, a doped isolation layer, to form a source region of the transistors; forming, in the substrate, parallel trench isolations and second trenches perpendicular to the trench isolations, reaching the isolation layer, and isolated from the substrate by a first dielectric layer; depositing a first conductive layer on the surface of the substrate and in the second trenches; etching the first conductive layer to form the vertical gates of the transistors, and vertical gate connection pads between the extremity of the vertical gates and an edge of the substrate, while keeping a continuity zone in the first conductive layer between each connection pad and a vertical gate; and implanting doped regions on each side of the second trenches, to form drain regions of the transistors.

18 Claims, 10 Drawing Sheets

METHOD OF MANUFACTURING A NON-VOLATILE MEMORY

BACKGROUND

1. Technical Field

The present disclosure relates to integrated circuit nonvolatile memories on semiconductor chips. The present disclosure relates in particular to memories comprising memory cells with programming and erasure via the channel, called "UCP" (Uniform Channel Program). The present disclosure relates more particularly to UCP memory cells with two transistors, comprising a selection transistor and a charge accumulation transistor such as a floating gate transistor.

2. Description of the Related Art

FIG. 1 is a schematic cross-sectional view of two memory cells C11, C12 of UCP type, formed on a P-type substrate PW. The electrical diagram of these two memory cells is shown in FIG. 2. The memory cell C11 comprises a floating gate transistor FGT11 and a selection transistor ST11. The memory cell C12 comprises a floating gate transistor FGT12 and a selection transistor ST12. Each floating gate transistor FGT11, FGT12 comprises a drain region n1 (D), a source region n2 (S), a floating gate FG, a control gate CG, and a channel region CH1 extending beneath the floating gate FG between the drain n1 and source n2 regions. Each selection transistor ST11, ST12 comprises a drain region n2 (D) common to the source region n2 of the corresponding floating gate transistor FGT11, FGT12, a source region n3 (S), a gate SG, and a channel region CH2 extending under the gate SG between the drain n2 and source n3 regions. The two transistors ST11, ST12 share the same source region n3. This structure with two memory cells C11, C12 has a symmetry axis passing through the source region n3.

The regions n1, n2, n3 are generally formed by N doping of the substrate PW. The substrate PW is generally a P-type well formed in a base substrate or "wafer" WF. The well PW is isolated with respect to the rest of the wafer WF by means of an N-doped isolation layer NISO that surrounds the entire well. The gates FG, SG are generally of level 1 polysilicon (polycrystalline silicon) or "poly1", and are formed on the substrate PW by the intermediary of oxide layers D1, D2, the layer D1 being a tunnel oxide layer whereas the layer D2 is a gate oxide layer. The control gate CG is generally of level 2 polycrystalline silicon or "poly2", and is formed on the floating gate FG by the intermediary of an oxide layer D3. These various oxide layers comprise for example silicon dioxide $SiO_2$.

The two memory cells are covered by a dielectric isolating material D0, which may also be oxide $SiO_2$. The drain regions n1 of the transistors FGT11, FGT12 are linked to a same bitline BL by means of a contact C1 traversing the isolating material D0 to reach an intermediary conductor T1 formed in a first metal layer, or "metal1", and a conductive via V1 traversing the isolating material D0 to link the conductor T1 to the bitline BL, which is formed for example in a second metal layer, or "metal2". The source region n3 common to the two transistors ST11, ST12 is linked to a source line SL by means of a contact C2 traversing the isolating material D0, the source line SL being for example formed in the first metal layer.

During a read of the cell C11, the selection transistor ST12 receives a blocking voltage Voff and is not conducting. A current flows only in the channel region CH1 of the transistor FGT11 and in the channel region CH2 of the transistor ST11. This current is representative of the threshold voltage of the transistor FGT11, which is itself representative of a programmed or erased state of the transistor, which depends on a quantity of electrical charges stored in its floating gate. This current is detected (or "sensed") by a sense amplifier (not shown) that supplies a binary data stored by the cell C11.

The transistor ST12 being blocked by the voltage Voff, a "non-read" voltage value Vnrd applied to the transistor FGT12 is not very high because this transistor is isolated from the source region n3 by the transistor ST12. The voltage Vnrd is chosen to be equal to a biasing voltage VB1 of the substrate PW, which may be equal to ground, that is the potential of the wafer WF, generally at 0 V.

The cells C11, C12 have the advantage of being programmable or erasable by application of a pair of determined voltages to the substrate PW and to the control gate CG of their transistor FGT11, FGT12, this programming and erasing mode being known as "channel programming and erasing". The transfer of charges from the substrate PW to the floating gate FG (programming) or from the floating gate to the substrate (erasure) is done without passing through the selection transistor ST11, as well as the application of a high potential difference (for example 15 V) allowing this transfer of charges. Thus, the steps of programming, erasing, and reading are done with low value voltages, by exploiting the difference of potential between the substrate and the control gate of the floating gate transistors. Thus, the selection transistors ST11, ST12 are not subjected to high voltages, which allows for memory cells C11, C12 of simple conception and small semiconductor surface area.

Despite the advantages offered by such UCP memory cells, it may be desired to provide a means allowing their surface area to be reduced still further, in order to reduce the surface area of a memory array comprising a plurality of such memory cells. It may also be desired to provide a memory structure of small surface area.

BRIEF SUMMARY

Embodiments of the disclosure relate to a method of manufacturing an integrated circuit in a semiconductor substrate, the integrated circuit comprising vertical gate transistors. The method comprises steps of implanting, in the depth of the substrate, a doped isolation layer, to form a source region of the transistors; forming, in the substrate, first parallel trench isolations; forming, in the substrate, second trenches perpendicular to the first trenches, reaching the isolation layer, and isolated from the substrate by a first isolation layer, each trench comprising an extremity distanced from the edges of the substrate; depositing a first conductive layer on the surface of the substrate and in the second trenches; etching the first conductive layer to form trench conductors in the second trenches forming vertical gates of the transistors, and to form gate connection pads each extending between the extremity of a second trench and an edge of the substrate, while keeping a continuity zone in the first conductive layer between the second trenches and the connection pads; and implanting doped regions on each side of the second trenches to form drain regions of the transistors.

According to one embodiment, the method comprises steps of depositing, on the first conductive layer, a second isolating layer and a second conductive layer, the second isolating layer and the second conductive layer being etched with the first conductive layer, to form the trench conductors and the connection pads; etching a portion of the connection pads by removing the second conductive layer and the second isolating layer; and forming a contact on the first conductive layer in each etched portion of the connection pads.

According to one embodiment, the etching of the first conductive layer, of the second isolating layer, and of the second conductive layer is performed to form, at the surface of substrate and parallel to the second trenches, floating gates and control gates of charge accumulation transistors, each forming a memory cell with one of the vertical gate transistors, and conductive lines interconnecting the control gates, the implantation of doped regions being done to also form drain and source regions of the charge accumulation transistors.

According to one embodiment, the floating gates, the control gates, and the conductive lines extend parallel to the second trenches on the surface of the substrate, with two conductive lines per trench conductor, one being placed to the left of the trench conductor, and the other being placed to the right of the trench conductor.

According to one embodiment, the second trenches are formed by a selective etch of the isolating material in the first trenches, and by a selective etch of the semiconductor material of the substrate between and below the first trenches, in order to obtain a second trench with a bottom forming undulations comprising shallower portions between the trench isolations, separated by portions reaching the isolation layer under the etched portions of the trench isolations.

According to one embodiment, the connection pads present a width greater than the width of the second trenches.

Embodiments of the disclosure also relate to an integrated circuit comprising: vertical gate transistors in a semiconductor substrate; a doped isolation layer, implanted in the depth of the substrate, and forming a source region of the transistors; parallel trench isolations; trench conductors isolated from the substrate by an isolating layer formed perpendicularly to the trench isolations and reaching the isolation layer, the trench conductors forming vertical gates of the transistors; doped regions implanted on each side of the trench isolations, between the trench isolations, to form drain regions of the transistors; and gate connection pads, each extending between an extremity of the trench conductor and an edge of the substrate, with an electrical continuity zone between the connection pad and the interior of the trench conductor.

According to one embodiment, the integrated circuit comprises: charge accumulation transistors, each forming a memory cell with one of the vertical gate transistors; conductive lines forming control gates of the charge accumulation transistors and control gate interconnection lines; and doped regions forming drain regions of the charge accumulation transistors, the doped regions forming the drain regions of the vertical gate transistors also forming the source regions of the charge accumulation transistors.

According to one embodiment, each control gate of the charge accumulation transistors is formed on a floating gate isolated from the substrate by a first isolating layer and isolated from the control gate by a second isolating layer.

According to one embodiment, the integrated circuit comprises contacts, each formed on one of the connection pads, through a conductive layer and an isolation layer.

According to one embodiment, the trench conductors comprise a bottom forming undulations presenting shallow portions between the trench isolations, separated by portions reaching the isolation layer.

According to one embodiment, the connection pads present a width greater than the width of the second trenches.

BRIEF DESCRIPTION OF THE SEVERAL VIEWS OF THE DRAWINGS

Embodiments of the disclosure will be described in the following, in a non-limiting manner in relation with the appended drawings among which.

DETAILED DESCRIPTION

Figure 1:
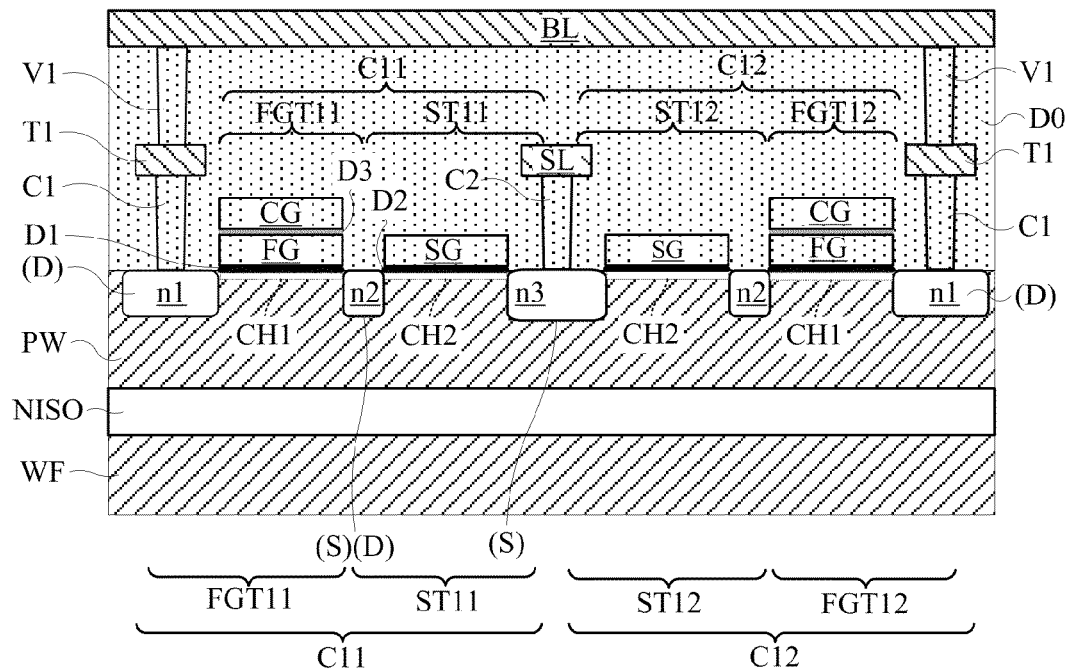
FIG. 1, previously described, schematically shows a cross-sectional view of two conventional memory cells, FIG. 2, previously described, is the electrical diagram of the two memory cells of FIG. 1, FIG. 3 schematically shows a cross-sectional view of two memory cells according to one embodiment.
Figure 2:
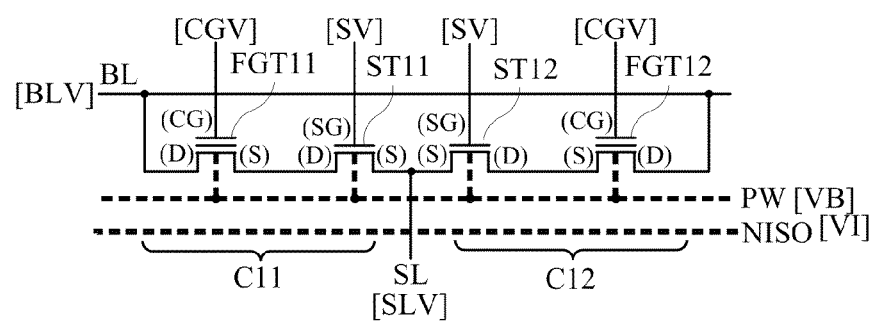
Figure 3:
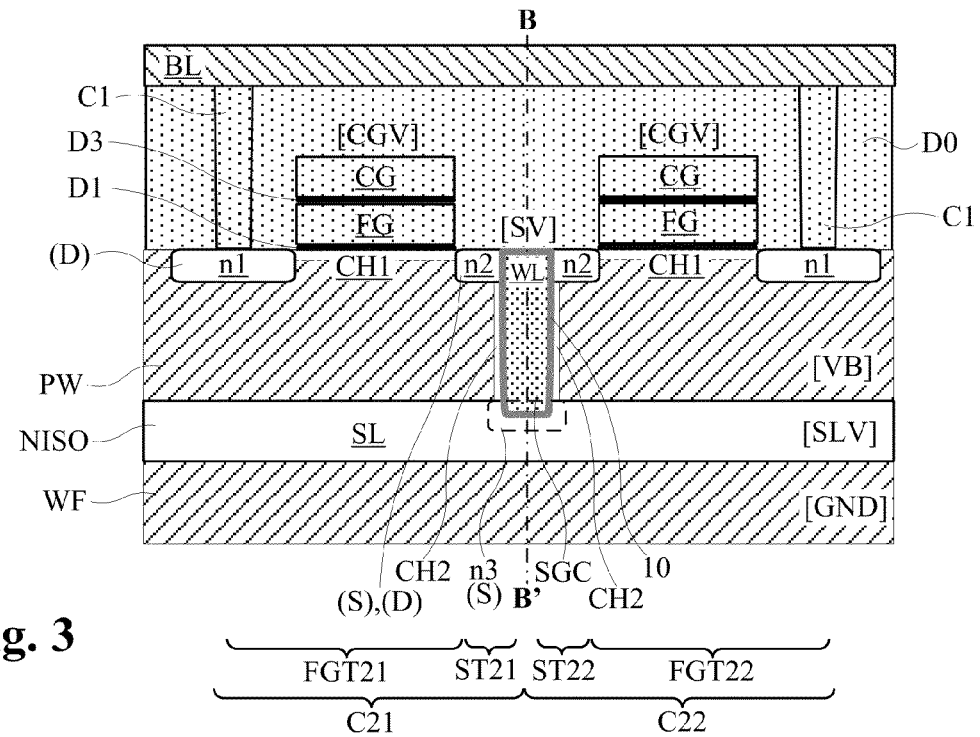

FIG. 3 shows a structure of a pair of memory cells C21, C22 according to the disclosure. The memory cell C21 comprises a floating gate transistor FGT21 and a selection transistor ST21. The memory cell C22 comprises a floating gate transistor FGT32 and a selection transistor ST32. The transistors FGT21, FGT22 may be of the same structure as the transistors FGT11, FGT12 and each has a horizontal channel region CH1 that extends beneath its floating gate FG, between the drain n1 and source n2 regions. The selection transistors ST21, ST22 differ from the selection transistors ST11, ST12 in that they comprise a common vertical gate SGC. This vertical gate SGC is buried in the substrate PW by a dielectric isolating layer 10, for example of silicon dioxide $SiO_2$, forming the gate oxide of the selection transistors ST21, ST22. It extends in the depth of the substrate PW and has lower left and right edges that penetrate into the layer NISO. The layer NISO here forms, in its portion surrounding the lower left and right edges of the gate SGC, the source region (S) of the transistors ST21, ST22. The layer NISO also forms, as previously, the source line SL of these transistors. The drain regions n2 (D) of the transistors ST21, ST22 (which also form the source regions of the floating gate transistors) are conserved, but extend here along an upper left edge and an upper right edge of the gate SGC.

Thus, the transistor ST21 has a vertical channel region CH2 that extends opposite the left vertical sidewall of the gate SGC, between one of the regions n2 and a doped region n3 in the layer NISO. Similarly, the transistor ST22 has a vertical channel region CH2 that extends opposite the right vertical sidewall of the gate SGC, between the other of the regions n2 and the region n3 in the layer NISO.

With respect to the structure of the pair of memory cells C11, C12, the structure of the pair of memory cells C21, C22 has the advantage of occupying much less semiconductor surface area, due to the absence of the selection transistors ST21, ST22 on the surface of the substrate, as they have become buried transistors.

As it will be seen later in the light of examples of methods of fabrication, the vertical gate SGC is made from a trench conductor that links several pairs of memory cells and is shown in cross-section in FIG. 3. Depending on the method of fabrication employed, this trench conductor forming the gate SGC might not have an electrical discontinuity. It may therefore be used directly as a wordline WL, as indicated by the reference "WL" in FIG. 3.

In other embodiments, this trench may be severed into several portions by shallow trench isolations STI. In this case, each vertical gate SGC of each pair of memory cells is independent of the others and is individually connected to a wordline formed in a metal layer.

Figure 4:
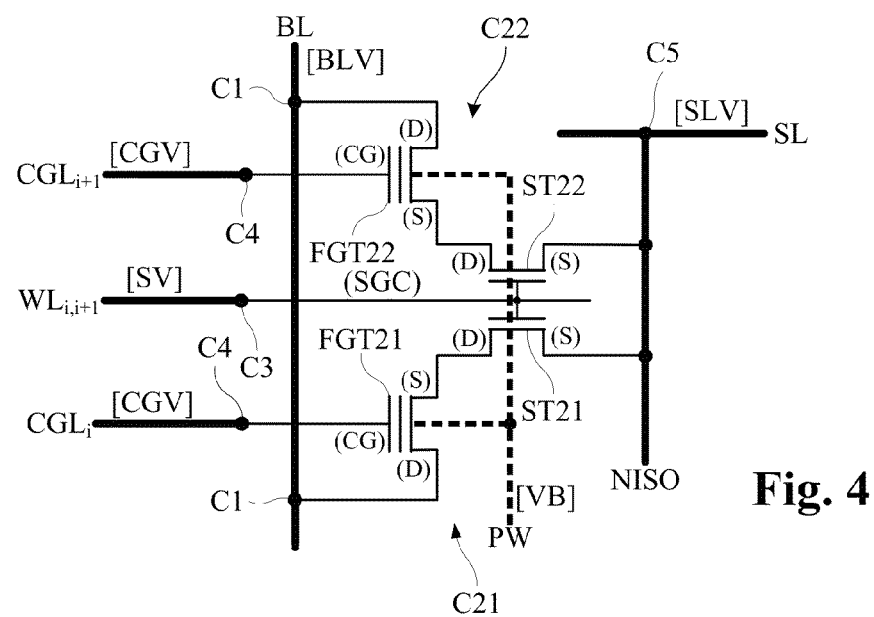
FIG. 4 is the electrical diagram of the memory cells of FIG. 3, FIGS. 5A to 5C are top, longitudinal cross-sectional and transversal cross-sectional views of a memory array comprising the memory cells of FIG. 3, FIGS. 6A to 6E each show longitudinal and transversal cross-sectional views showing steps of a method of memory cell fabrication according to one embodiment, FIGS. 7A to 7M each show longitudinal and transversal cross-sectional views showing steps of a method of memory cell fabrication according to another embodiment.

FIG. 4 is the electrical diagram of the memory cells C21, C22. The control gate of the transistor FGT21 is connected to a control gate line $CGL_i$ by means of a contact C4. The control gate of the transistor FGT22 is connected to a control gate line $CGL_{i+1}$ by means of a contact C4. The drain (D) regions of the transistors FGT21, FGT22 are connected to a bitline BL by means of contacts C2. The vertical gate SGC is connected to a wordline $WL_{i,i+1}$ common to the two memory cells by means of a contact C3. Alternatively, the vertical gate itself may form the wordline $WL_{i,i+1}$, as indicated above. The channel regions of the transistors FGT21, FGT22, ST21, ST22 are a part of the same well PW, as shown by the dotted lines. Lastly, the source (S) regions of the transistors ST21, ST22 are electrically coupled to the layer NISO forming the source line. The source line may be connected by means of a contact C5 to a general source line SL formed in a metal layer.

Figure 5A:
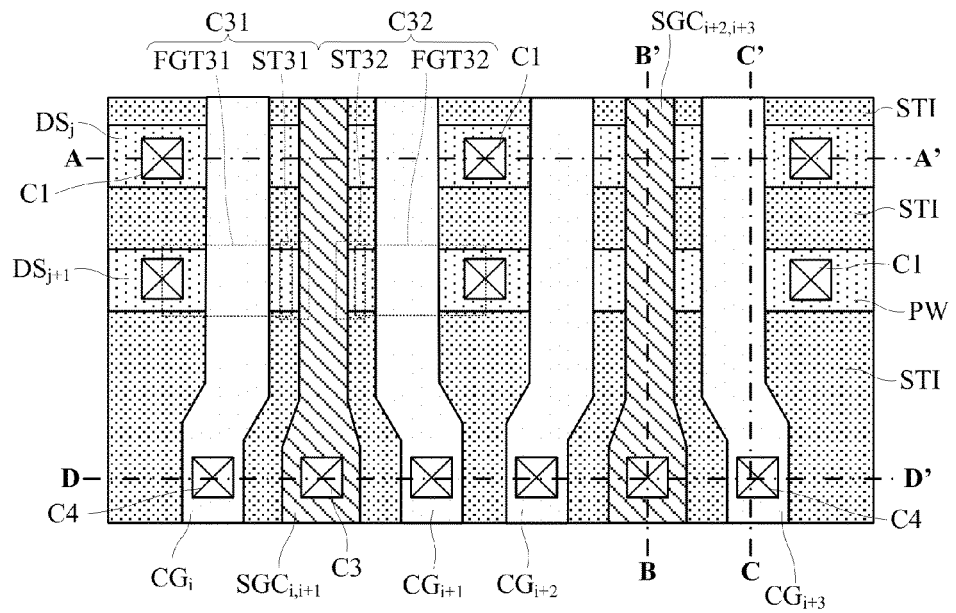
Figure 5B:
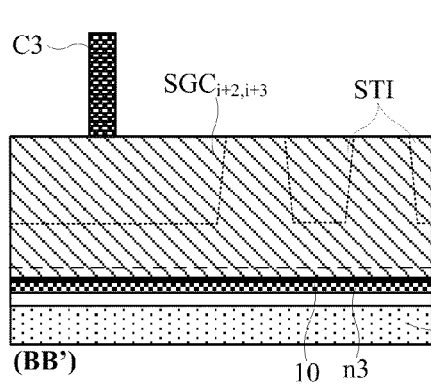
Figure 5C:
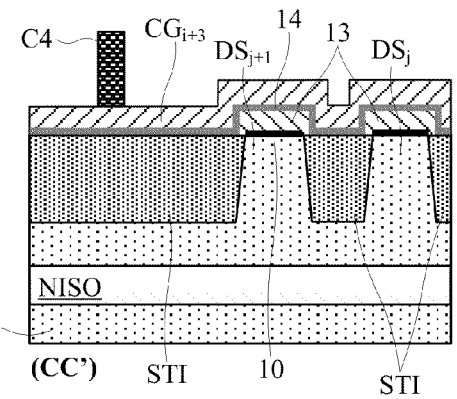

FIGS. 5A to 5C show a portion of a memory array comprising the memory cells of FIG. 3. FIG. 5A is a top view of the memory array near its edge. FIGS. 5B and 5C are cross-sectional views along the respective lines BB' and CC' indicated in FIG. 5A. The line BB' cuts through a trench conductor $SGC_{i+2,i+3}$ and the line CC' cuts through a conductive line $CG_{i+3}$ parallel to the trench conductor. It should be noted that FIG. 3 is a cross-sectional view along a line AA' indicated in FIG. 5A and cutting through a semiconductor strip $DS_j$ perpendicular to the lines BB' and CC.'

FIG. 5A shows trench conductors $SGC_{i,i+1}$, $SGC_{i+2,i+3}$ parallel between themselves, formed in the substrate PW and isolated from this later by means of a isolating layer 10 (FIG. 3), dielectric shallow trench isolations STI formed perpendicularly to the trench conductors $SGC_{i,i+1}$, $SGC_{i+2,i+3}$. The trench isolations STI delimit the semiconductor strips $DS_j$, $DS_{j+1}$ perpendicular to the trench conductors $SGC_{i,i+1}$, $SGC_{i+2,i+3}$, which form the drain and source regions of the floating gate transistors FGT21, FGT22. FIG. 5B shows that the trench conductors STI are severed by the trench conductors $SGC_{i,i+1}$, $SGC_{i+2,i+3}$, the trench conductors $SGC_{i,i+1}$, $SGC_{i+2,i+3}$ extending into the layer NISO.

FIG. 5A also shows conductive lines $CG_i$, $CG_{i+1}$, $CG_{i+2}$, $CG_{i+3}$ parallel to the trench conductors $SGC_{i,i+1}$, $SGC_{i+2,i+3}$, formed at the surface of the substrate PW, with two conductive lines per trench conductor, one placed to the left of the trench conductor, the other placed to the right of the trench conductor. N-type dopants are implanted in the semiconductor strips $DS_j$, $DS_{j+1}$, to form the drain n1 and source n2 regions of the floating gate transistors. The source regions n2, which extend to the right and to the left of the trench conductors $SGC_{i,i+1}$, $SGC_{i+2,i+3}$, also form the drain regions of the selection transistors, in conformance with the memory cell structure shown in FIG. 3.

A last dielectric trench isolation STI, wider than the others, extends to the edge of the substrate. The contacts C3, C4 are formed at the edge of the substrate on the trench conductors $SGC_{i,i+1}$, $SGC_{i+2,i+3}$, (FIG. 5B) and on the conductive lines $CG_i$ to $CG_{i+3}$ (FIG. 5C). The contacts C1 are formed on the strips $DS_j$, $DS_{j+1}$ between each pair of memory cells, that is to say, each group comprising a trench conductor SGC and the two adjacent conductive lines CG. FIG. 5C also shows the conductive line $CG_{i+3}$ formed on the floating gates 13 of the floating gate transistors. The gates 13 are formed on the oxide layer 10 above the strips $DS_j$, $DS_{j+1}$, and are covered by an oxide layer 14. Each line CG thus forms control gates above the floating gates 13 and a control line interconnecting the control gates of a line of floating gate transistors.

Figure 6A:
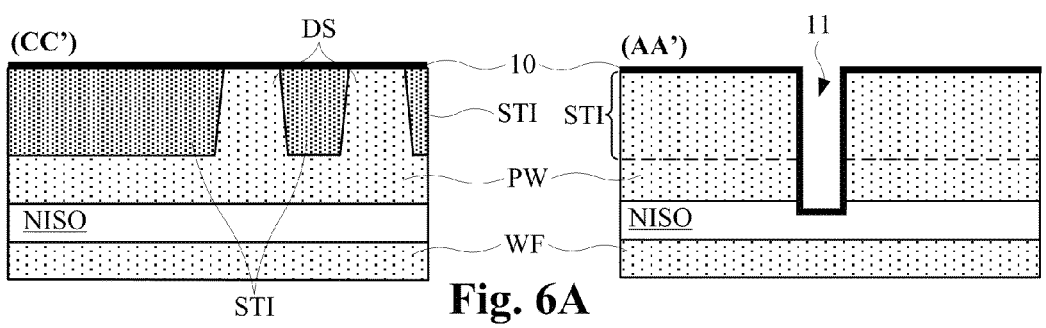
Figure 6B:
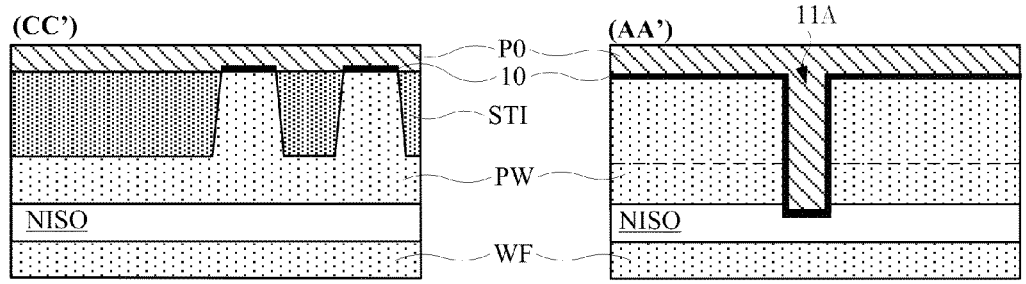
Figure 6C:
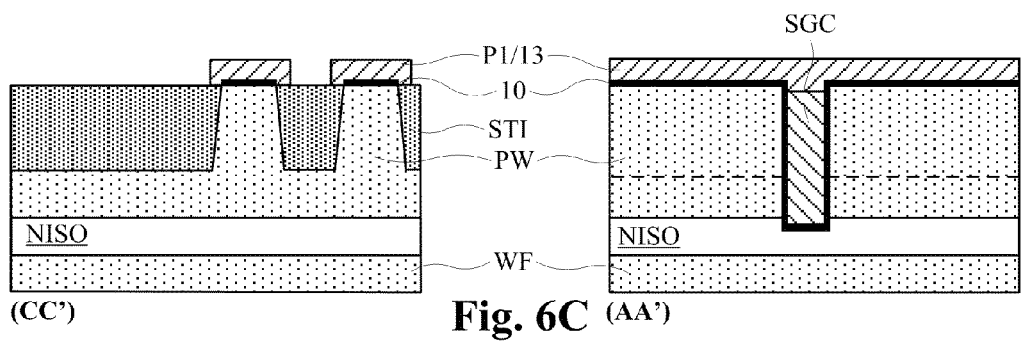
Figure 6D:
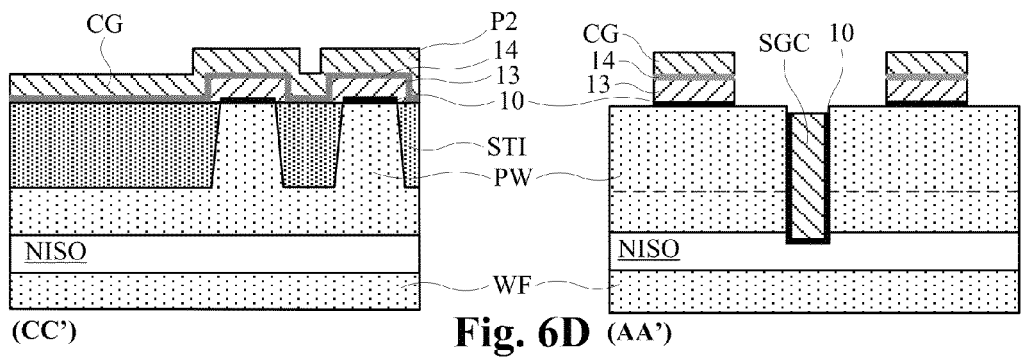
Figure 6E:
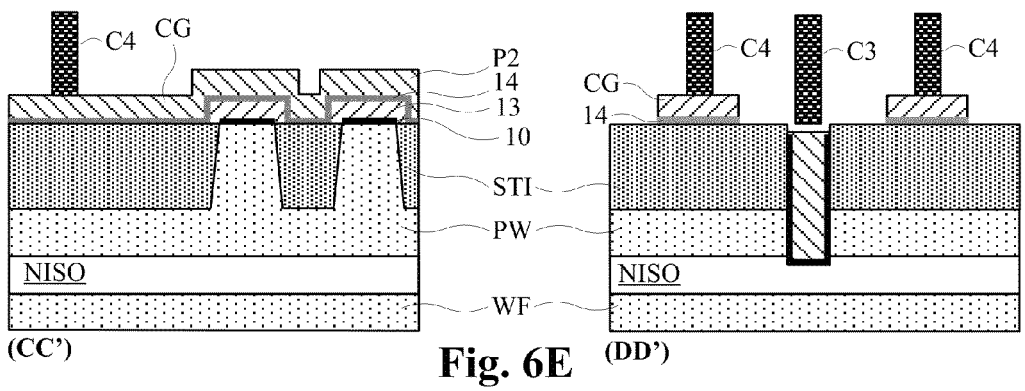

Steps of a method of fabrication of memory cells in an integrated circuit are shown in the FIGS. 6A to 6E by cross-sectional views of a portion of the semiconductor substrate SW. Each FIG. 6A to 6D, shows on the left a cross-sectional view along the line CC' at the edge of the substrate SW, and on the right, a cross-sectional view along the line AA', of the substrate WF (the lines AA' and CC' are shown in FIG. 5A). FIG. 6E shows on the left a cross-sectional view along line CC', and on the right a cross-sectional view along a line DD' indicated in FIG. 5A.

At the steps shown by FIG. 6A, an N-doped isolation layer NISO is implanted in the substrate WF, to delimit a P-type well PW in which the memory array is formed. The vertical sidewalls of the isolation layer NISO are not shown. Optionally, a P-doped layer is also implanted in the well, above the layer NISO. Trench isolations STI are then formed in the well PW. The trench isolations are parallel with respect to each other and are formed by etching the substrate SW and filling the obtained trenches with a dielectric material such as silicon dioxide. These trench isolations cause semiconductor strips DS to appear in the well PW. The semiconductor strips are destined to later form the drain and source regions of floating gate transistors. Trenches 11 are then formed perpendicular to the trench isolations STI. The trenches 11 are here sufficiently deep to reach the layer NISO. The etching of the trenches 11 also removes the isolating material of the trench isolations STI in the zones where they intersect. A tunnel oxide layer 10 (gate oxide) is deposited on the surface of the well PW and in the trenches 11. In order to simplify the drawings, only two trench isolations STI and one trench 11 are shown, but the method relates to the collective fabrication of memory cells to obtain a memory conventionally comprising a large number of memory cells.

At steps shown in FIG. 6B, an etching step removes the layer 10 outside of the strips DS and the trenches 11. A first polycrystalline silicon or "polysilicon" layer P0 is then deposited on the surface of the substrate PW and in the trenches 11, above the oxide layer 10. The first polysilicon layer P0 is then removed above the surface of the substrate PW, so that the surface of the substrate is ready for other manufacturing steps, described later. Trench conductors 11A of polysilicon remain, isolated from the substrate by the oxide layer 10, destined to form vertical gates SGC such as that shown in FIG. 3. During steps shown in FIG. 6C, a second polysilicon layer P1 is then deposited on the surface of the substrate PW, above the first layer P0. The layer P1 is thus the first level of polysilicon or "poly1". The layer P1 is etched to leave strips 13 perpendicular to the trench conductors 11A, the strips 13 being destined to form the floating gates of the floating gate transistors.

At steps shown in FIG. 6D, an oxide layer 14, for example of the ONO (Oxide-Nitride-Oxide) type and a polysilicon layer P2 are successively deposited on the surface of the substrate PW. The layer P2 is thus the second level of polysilicon or "poly2". The layers 14 and P2 are successively etched with a same mask to form the conductive lines CG including the control gates of the floating gate transistors.

At steps shown in FIG. 6E, the entirety of the substrate, including the conductive lines CG, is covered by a dielectric layer (not shown), such as oxide. Holes are made in this dielectric layer, and the holes are then metalized to form contacts C1, C3, C4, respectively on the strips DS (drain regions n1), on the vertical gates SGC, and on the conductive lines CG. These contacts were previously described in relation with FIG. 4, and are destined to connect the elements that have just been described to conductive tracks in metal that will be formed later above this dielectric layer.

It may happen that the layers P1 and 10 are over-etched and that the polysilicon is removed at the top of the trenches 11 (FIG. 6D). There is a risk of an electrical discontinuity between a selection gate contact C3 and the polysilicon in the trench 11 below the contact (FIG. 6E). The over-etching of the isolation layer may also form short circuits between the polysilicon 11A in the trenches 11 and the well PW.

Figure 7A:
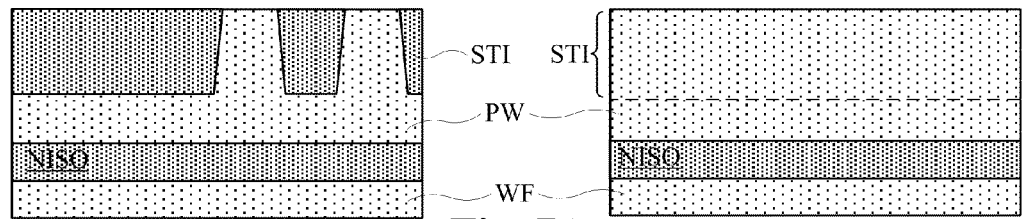

FIGS. 7A to 7M show steps of a method of fabrication of memory cells of an integrated circuit, according to another embodiment. Each figure, FIG. 7A to 7M, shows on the left a cross-sectional view along the line BB' at the edge of the substrate SW, and on the right, a cross-sectional view along the line AA' (cf. FIG. 5C). In FIG. 7A, an N-doped isolation layer NISO is implanted in the depth of the substrate WF, to delimit a P-type well PW in which the memory array is formed. The vertical sidewalls of the isolation layer NISO are not shown. Optionally, a P-doped layer is also implanted in the well, above the layer NISO. Trench isolations STI are then formed in the well PW. The trench isolations STI are parallel between themselves and are formed by etching the substrate SW and filling the obtained trenches with an insulating material such as silicon dioxide. The trench isolations STI cause semiconductor strips DS to appear in the well PW, the semiconductor strips being destined to form later the drain and source regions of floating gate transistors. In the view on the left of FIG. 7A, a trench STI wider than the others extends to the edge of the substrate.

Figure 7B:
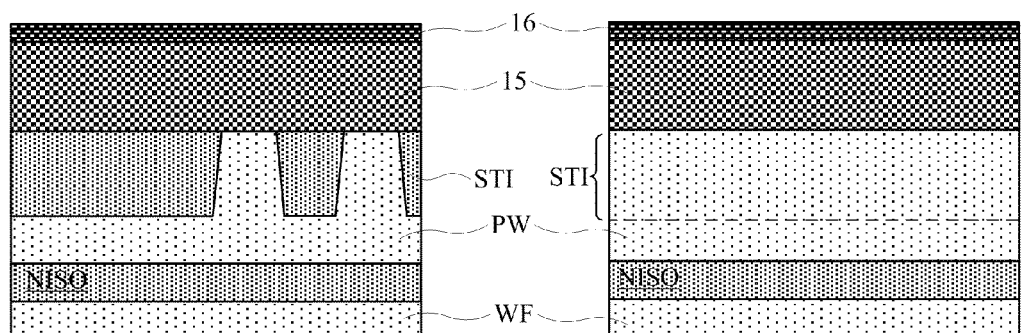
Figure 7C:
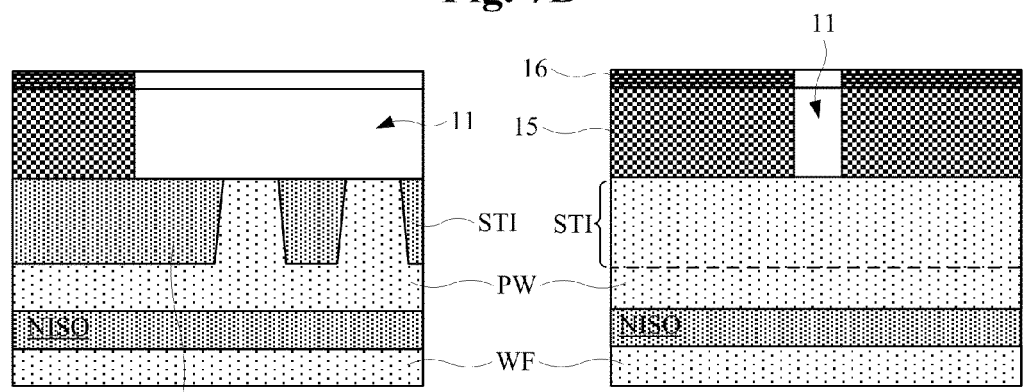
Figure 7D:
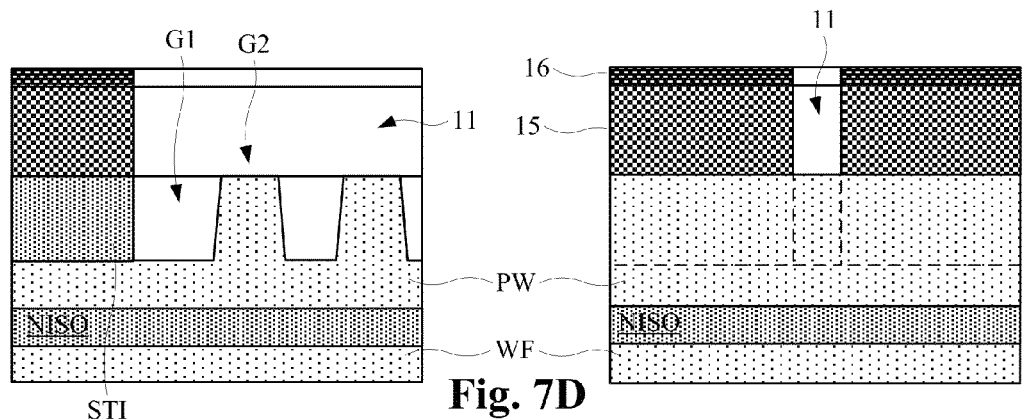

At the step shown in FIG. 7B, a hard mask layer 15 and an anti-reflective layer 16 are deposited on the substrate PW and the trench isolations STI. At the following step (FIG. 7C), trenches 11, perpendicular to the trench isolations STI, are successively etched through the layers 15 and 16. In the view on the left of FIG. 7C, the trenches 11 present an extremity distanced from the edge of the substrate PW. At the following step (FIG. 7D), a selective etch is performed of the insulating material (silicon dioxide) forming the trench isolations STI, through the layers 15, 16 comprising the trenches 11. The bottoms of the trenches 11 thus form undulations with deep portions G1 previously etched to form the trench isolations STI perpendicular to the trenches 11, and shallow portions G2 between the portions G1. The difference in depth between the portions G1 and G2 of the trenches 11 corresponds to the depth of the trench isolations STI reaching the top face of the substrate PW which was not previously etched.

Figure 7E:
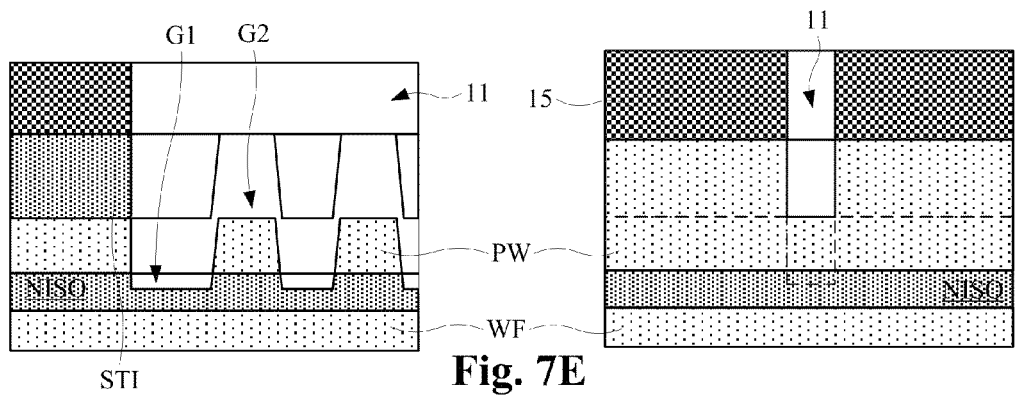
Figure 7F:
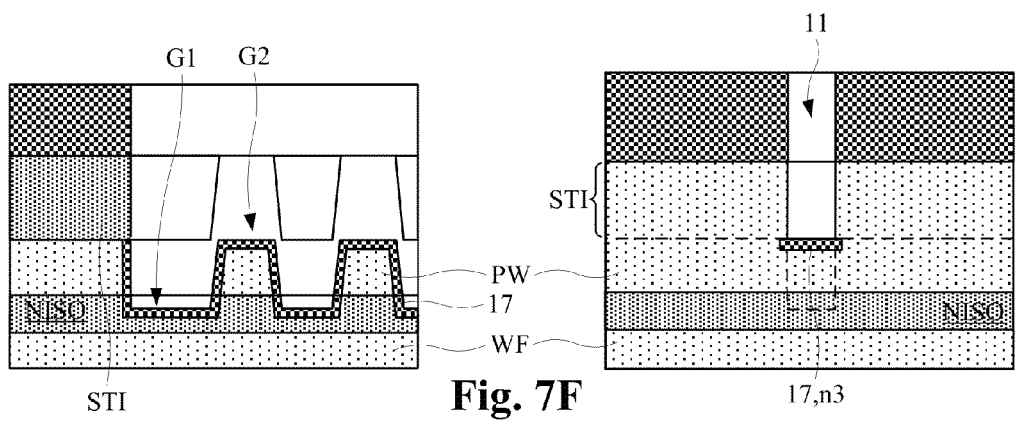
Figure 7G:
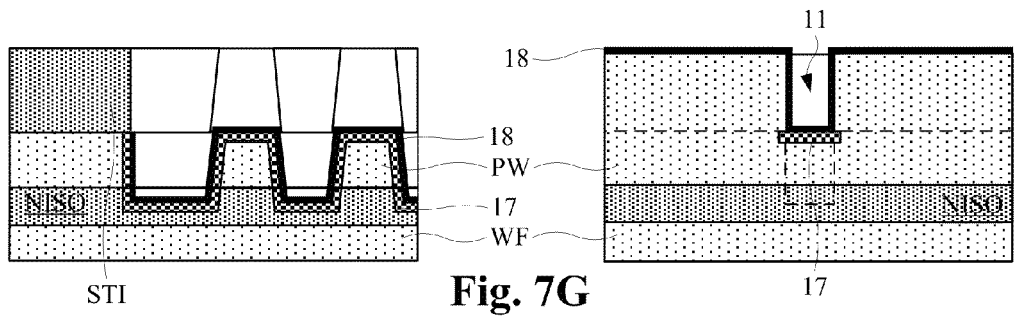
Figure 7H:
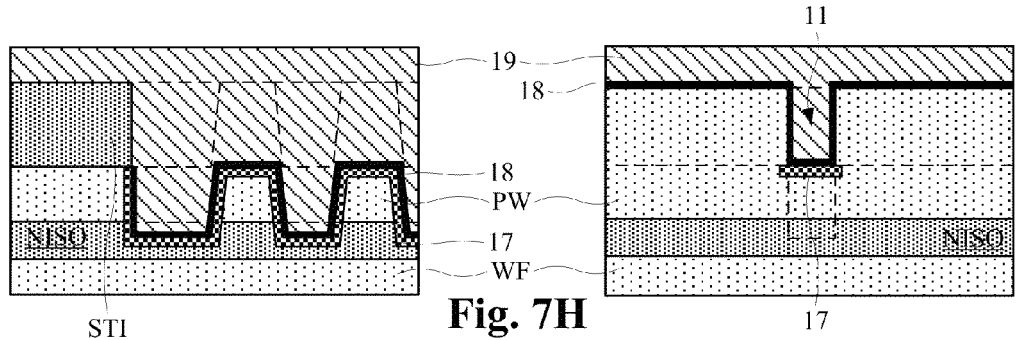

At the step shown in FIG. 7E, a selective etch of the silicon through the layers 15, 16 comprising the trenches 11 is performed, which also removes the layer 16. The silicon at the bottom of the trenches 11 is thus etched to reach the layer NISO in the portions G1. During this etching, the depth difference of the trenches 11 between the portions G1 and G2 is conserved and corresponds to the depth of the trench isolations STI. At the following step (FIG. 7F), N-type dopants 17 are implanted in the substrate PW at the bottoms of the trenches 11, to form doped regions n3 forming the source regions of the selection transistors. At the following step (FIG. 7G), the hard mask layer 15 is removed, and a tunnel oxide layer 18 is deposited on the surface of the substrate PW, including in the trenches 11. At the following step (FIG. 7H), a polysilicon layer 19 is deposited on the surface of the substrate PW and in the trenches 11, above the oxide layer 18. The layer 19 is thus the first level polysilicon layer or "poly1", destined to form the vertical gates of selection transistors and the floating gates of floating gate transistors.

Figure 7I:
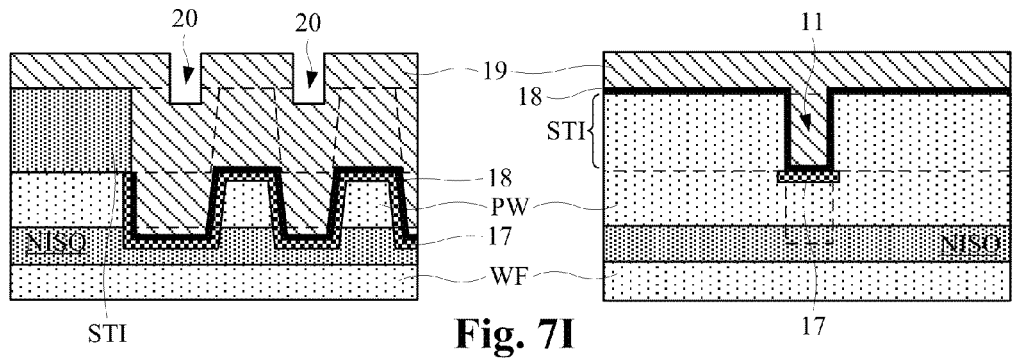
Figure 7J:
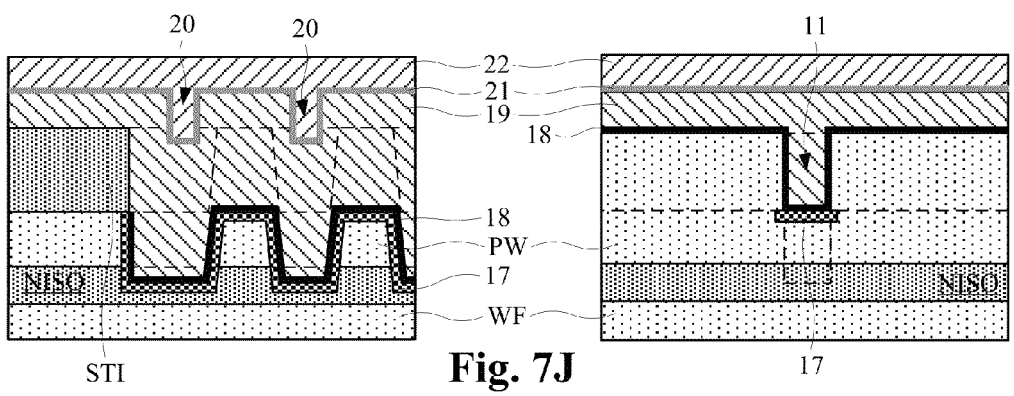

At the step shown in FIG. 7I, the layer 19 is etched to form grooves 20, in particular outside of the isolation layer STI and in the substrate PW to separate the floating gates of the floating gate transistors. At steps shown in FIG. 7J, the substrate PW is covered by an oxide layer 21, for example of the ONO type (Oxide-Nitride-Oxide), then by a new polysilicon layer 22 forming the second level of polysilicon or "poly2". The layer 22 is destined to form the control gates of the floating gate transistors.

Figure 7K:
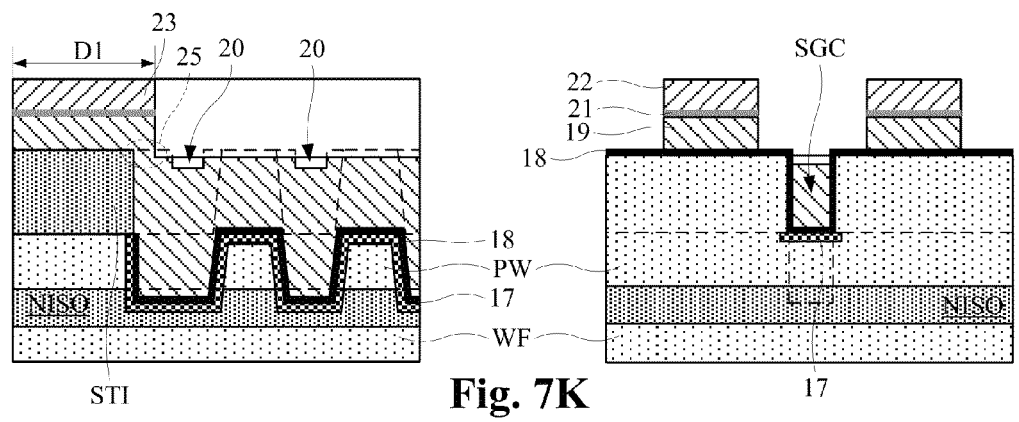

At the step shown in FIG. 7K, the layers 22, 21, and 19 are successively etched with a same mask to form the control gates and the floating gates of the floating gate transistors, as well as the conductive lines CG interconnecting the control gates. The etching of the layer 19 is done until the layer 18 is reached or a little further. Moreover, the etching of the layers 22, 21, and 19 is done in a manner so as to form connection pads 23 in the peripheral region of these layers, in the extension of the trenches 11. The connection pads have, from the edge of the substrate, a width D1 that is sufficient to form a connection in the pad 23, between the extremity of the trench 11 and the edge of the substrate, and leave an electrical continuity zone 25 in the layer 19, between the portion 23 at the edge of the substrate and the trench conductors 11A formed in the interior of the trenches 11.

Moreover, this etching is performed so as to remove a thin layer of polysilicon in the trenches 11. It should also be noted that the depth of this etching is such that it does not reach the bottom of the grooves 20, such that these grooves remain. Thus, if the width D1 is too small, there is no electrical continuity of the layer 19 at the edge of the substrate and the interior of the trenches 11. The length of the continuity zone 25, and thus the width D1, is thus chosen to be sufficient to overcome possible alignment errors of etching masks.

Figure 7L:
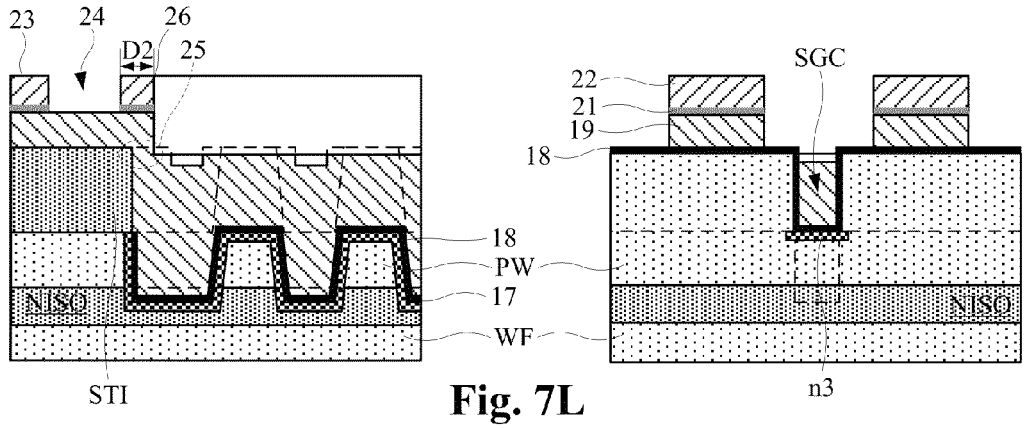

At the step shown in FIG. 7L, holes 24 are formed by etching the layers 22 and 21 in the connection pads 23, in order to form contacts. The holes 24 are formed at a distance D2 from the edge formed during the previous step, in the layer 19 between the trenches 11 and the connection pad 23. The distance D2 may be chosen to be sufficient to prevent the etching of the holes 24 from removing the layer 19 in the trenches 11 (at the foot of the stair), taking into consideration possible alignment errors of etching masks. A residue 26 of the layers 21, 22 having the width D2 thus remains on the connection pads 23. The residue 26, which is completely unnecessary for the operation of the memory cells, results from the simultaneous etching of the layers 22, 21, and 19.

At the following steps (FIG. 7M), N-type dopants are implanted in the surface of the substrate to form drain regions n1 of the floating gate transistors, as well as their source regions n2, which are common to the drain regions of the selection transistors. Then, the contacts C1, C3, and C4 are formed, the contacts C3 being formed in the holes 24, and the contacts C1 being formed on the drains n1 of the floating gate transistors. The contacts C4 are formed in the manner shown in FIG. 6E.

Figure 7M:
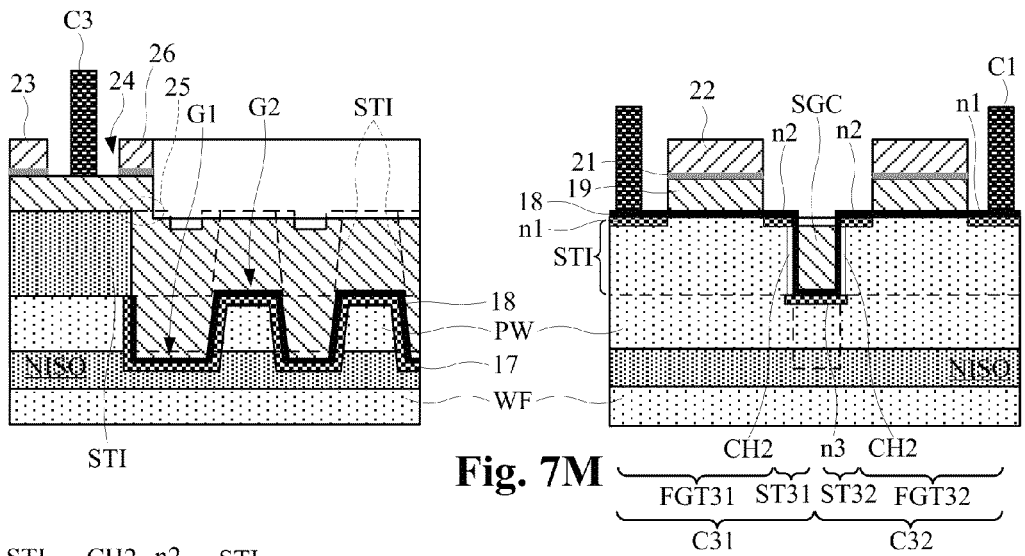

The method that has just been described allows memory cells C31, C32 to be formed, each comprising a floating gate transistor FGT31, FGT32, and a selection transistor ST31, ST32 with a vertical gate SGC and a vertical channel CH2 (FIG. 7M). The gates of the selection transistors are formed by trench conductors SGC comprising deep portions G1 reaching the layer NISO below the trench isolations STI, and shallow portions G2 not reaching this layer in the semiconductor strips DS. The vertical gates of the selection transistors ST31, ST32, which are formed by the portions G2, thus have a shorter channel CH2 in comparison with the transistors ST21, ST22 shown in FIG. 3.

Figure 8:
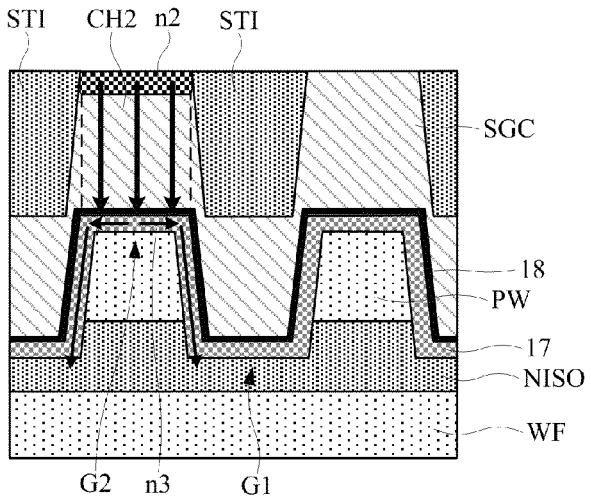
FIG. 8 shows a cross-sectional view of a trench conductor forming the gate of selection transistors of memory cells.

The electrical continuity between each channel CH2 of the selection transistors ST31, ST32 and the layer NISO is ensured by the portion of the doped region 17 extending between the portions G1 and G2. Thus, FIG. 8 is a cross-sectional view of the memory array along a plane parallel to a trench conductor SGC through the channels CH2 of selection transistors ST31, ST32, the gate of which is formed by the trench conductor SGC. FIG. 8 shows a channel CH2 of a selection transistor between two trench isolations STI. Arrows show the current distribution between the drain region n2 and the source region n3 in the layer NISO. The current lines are channeled in the channel CH2 along a substantially vertical face of the trench conductor SGC, between two trench isolations STI, between the drain region n2 and the doped region 17 forming the source region n3 of the selection transistor. The current lines are then channeled by the region 17 on one hand and on the other hand by the portion G2 along the adjacent portions G1 until the layer NISO is reached.

According to another embodiment of the fabrication method, the trenches 11 are systematically etched until the layer NISO without forming the undulations G1, G2. Thus, at steps shown in FIGS. 7D, 7E, the oxide layer in the trench isolations STI and the substrate PW may be etched until the layer NISO is reached. This disposition does not prevent the formation of the electrical continuity zones 25 between the trench conductors SGC and the layer 19 in the connection pads 23.

Figure 9A:
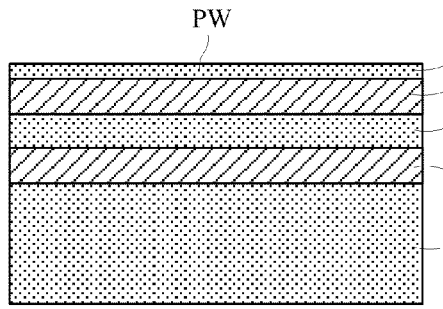
FIGS. 9A to 9E are top views of steps of the method of memory cell fabrication, and FIG. 10 schematically shows an electronic device comprising a memory according to the disclosure.

FIGS. 9A to 9E show top views of certain steps that have just been described. In FIG. 9A, the shallow trench isolations STI, parallel between themselves, are formed in the substrate PW. For the purpose of simplification of the drawings, only two trenches are shown, but the method relates to the collective fabrication of memory cells, to form a memory. The trench isolations STI are formed in conformance with the method of fabrication that has just been described, by etching the semiconductor and filling the obtained trenches with oxide. The trenches cause semiconductor strips $DS_j$, $DS_{j+1}$ to appear in the substrate, the strips being destined to later form the drain and source regions of floating gate transistors.

Figure 9B:
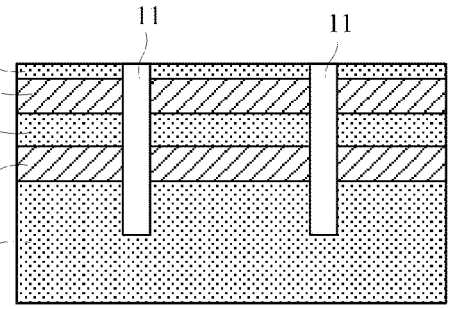

During a step shown in FIG. 9B, trenches 11, perpendicular to the trench isolations STI, are formed in the substrate PW. Only two trenches are shown for reasons of simplicity. The etching of the trenches 11 also etches the trench isolations STI in intersection zones. The trench isolations STI are not as deep as the trenches 11. Each of the trenches 11 is destined to form a vertical gate SGC common to two rows of selection transistors.

Figure 9C:
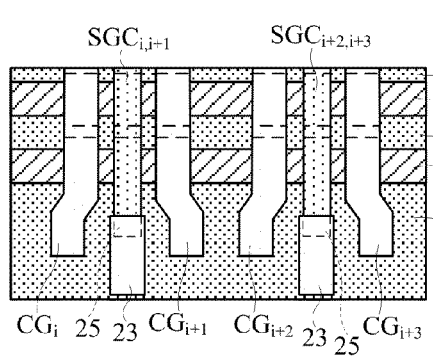

During steps shown in FIG. 9C, the gates of the selection transistors, the floating gates and the control gates of the floating gate transistors, and the conductive lines $CG_i$, $CG_{i+1}$, $CG_{i+2}$, $CG_{i+3}$ superimposed on the floating gates, are formed. These steps comprise the successive deposition of a first tunnel oxide layer on the surface of the substrate PW, and of a first polysilicon layer or "poly1". The "poly1" layer is then etched to form the grooves 20. A second oxide layer, for example of the ONO type, is then deposited, followed by a second polysilicon layer ("poly2"). These three layers are then etched into strips to form the trench conductors $SGC_{i,i+1}$, $SGC_{i+2,i+3}$ in the trenches 11, as well as the floating gates and the conductive lines $CG_i$, $CG_{i+1}$, $CG_{i+2}$, $CG_{i+3}$ also forming the control gates of the floating gate transistors, which are superimposed on the floating gates. The floating gates and the conductive lines $CG_i$, $CG_{i+1}$, $CG_{i+2}$, $CG_{i+3}$ extend parallel to the trench conductors $SGC_{i,i+1}$, $SGC_{i+2,i+3}$, on the surface of the substrate PW, with two conductive lines per trench conductor, one placed to the left of the trench conductor, the other placed to the right of the trench conductor. Once etched, the layer "poly1" forms both the gates of the selection transistors in the trench conductors $SGC_{i,i+1}$, $SGC_{i+2,i+3}$, the floating gates of the floating gate transistors, and the connection pads 23 of width D1 at the edge of the substrate on the extension of the trenches 11. The etching of the "poly2", oxide, and "poly1" layers is done whilst conserving the continuity zone 25 between the "poly1" layer deposited at the edge of the substrate PW and that within the trench conductors 11. The width of the connection pads 23 may be greater than the width of the trenches 11, which facilitates the formation of the contacts C3 later.

It will be understood that a single strip comprising the floating gates, the control gates, and the conductive lines $CG_i$, $CG_{i+1}$, $CG_{i+2}$, $CG_{i+3}$, could be formed for each trench conductor $SGC_{i,i+1}$, $SGC_{i+2,i+3}$.

Figure 9D:
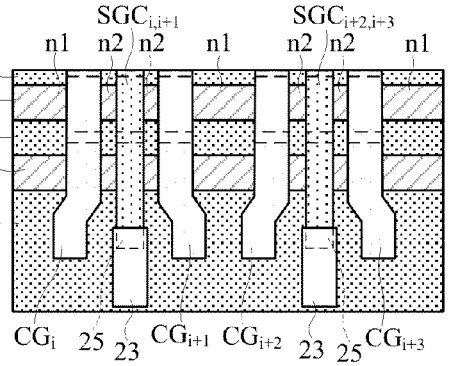

During a step shown in FIG. 9D, N-type dopants are implanted in the semiconductor strips $DS_j$, $DS_{j+1}$, to form drain n1 and source n2 regions of the floating gate transistors. The source regions n2, which extend to the right and to the left of the trench conductors $SGC_{i,i+1}$, $SGC_{i+2,i+3}$, also form the drain regions of the selection transistors of the memory cells.

Figure 9E:
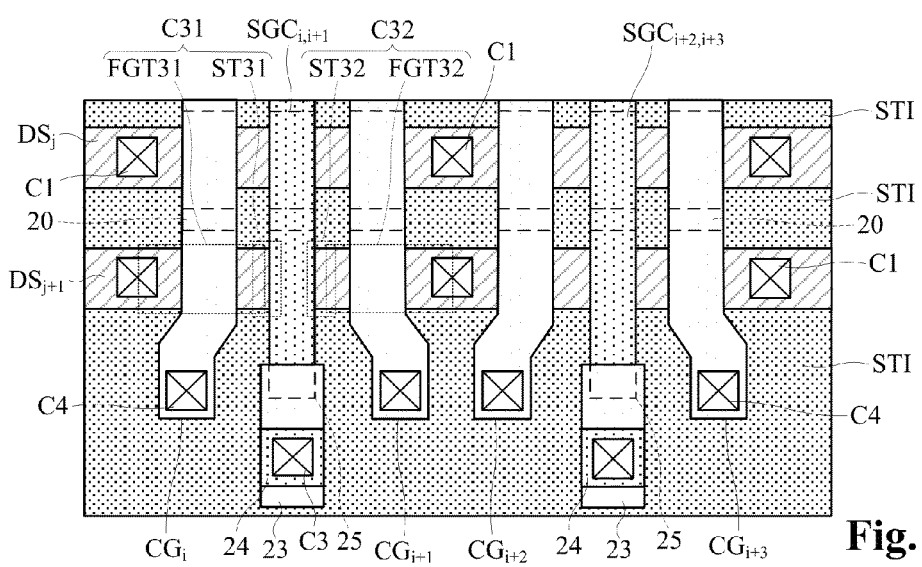

During steps shown in FIG. 9E, holes 24 are formed in the connection pads 23 at the edge of the substrate on the extension of the trench conductors $SGC_{i,i+1}$, $SGC_{i+2,i+3}$. The ensemble of the substrate, including the conductive lines $CG_i$, $CG_{i+1}$, $CG_{i+2}$, $CG_{i+3}$, is then covered by a dielectric layer, such as oxide. This dielectric layer is not shown in the drawing so as to show the elements that it covers. Holes are formed in this dielectric layer, and the holes are then metalized to form contacts C1, C3, C4. As previously, the contacts C1 are destined to connect the drain regions n1 to bitlines. The contacts C4 are destined to connect the conductive lines $CG_i$, $CG_{i+1}$, $CG_{i+2}$, $CG_{i+3}$ to gate control elements of the integrated circuit. The contacts C3 are destined to connect the trench conductors $SGC_{i,i+1}$, $SGC_{i+2,i+3}$ to the rest of the integrated circuit.

The steps that have just been described are followed by steps of forming the metal tracks evoked above, or of interconnection lines allowing the memory cells to be linked to control elements of the integrated circuit. These steps are conventional in and of themselves and will not be described.

In comparison with the method shown by FIGS. 6A to 6E, the method that has just been described (FIGS. 7A to 7M and 9A to 9E) overcomes the previously mentioned problems of connecting the trench conductors $SGC_{i,i+1}$, $SGC_{i+2,i+3}$ to the rest of the integrated circuit, or of having to deposit and etch an additional polysilicon layer to form the connection pads 23.

Figure 10:
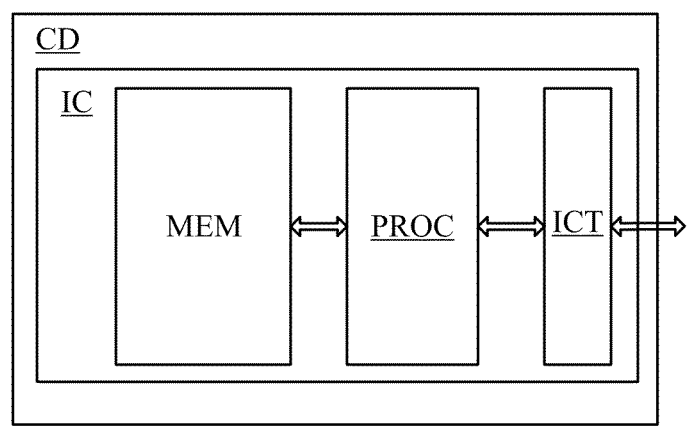

FIG. 10 shows an application example of a memory MEM according to the disclosure. The memory MEM is arranged in an integrated circuit IC equipped with a processor and a communication interface circuit ICT, such as an integrated circuit for a chip card. The integrated circuit is mounted on a support CD, such as a plastic card. The memory MEM allows, for the same memory capacity, the size and the cost price of the integrated circuit to be reduced, or, for the same integrated circuit surface area, the storage capacity of the memory to be increased.

It will be clearly understood by the skilled person that the disclosure applies in a general manner to the fabrication of vertical gate transistors in circuits other than nonvolatile memories. Indeed, the disclosure also applies to any trench conductor, including that with a flat bottom, as long as it is isolated from the substrate in order to form a transistor gate.

If the etching step shown in FIG. 7K relates to three layers, this step may only concern the conductive layer filling the trench conductor.

It will also appear to the skilled person that a memory cell according to the disclosure and a memory according to the disclosure are susceptible of various other alternative embodiments and applications. In particular, even though embodiments of memory cells comprising a floating gate transistor have been disclosed in the preceding, other types of charge accumulation transistors may be used, such as transistors comprising silicon dots embedded in a dielectric material, which allow electrical charges to be accumulated and may replace a floating gate.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An integrated circuit comprising:
   vertical gate transistors in a semiconductor substrate;
   a doped isolation layer implanted in the substrate and forming a source region of the transistors;
   parallel trench isolations;
   trench conductors formed perpendicularly to the trench isolations, and reaching the isolation layer, the trench conductors forming vertical gates of the transistors;
   first dielectric layers respectively isolating the trench conductors from the substrate;
   first doped regions implanted on opposite sides of the trench isolations, and forming drain regions of the transistors; and
   gate connection pads, each extending between an extremity of a respective one of the trench conductors and an edge of the substrate, with an electrical continuity zone between the connection pad and the respective trench conductor.

2. The integrated circuit according to claim 1, comprising:
   charge accumulation transistors forming respective memory cells with the vertical gate transistors, respectively;
   conductive lines forming control gates of the charge accumulation transistors and control gate interconnection lines; and
   second doped regions forming drain regions of the charge accumulation transistors, the first doped regions also forming source regions of the charge accumulation transistors.

3. The integrated circuit according to claim 2, wherein each charge accumulation transistor includes:
   a floating gate;
   a second dielectric layer that isolates the floating gate of the charge accumulation transistor from the substrate; and
   a third dielectric layer that isolates the control gate of the charge accumulation transistor from floating gate of the charge accumulation transistor.

4. The integrated circuit according to claim 1, comprising:
   a second dielectric layer formed on the connection pads;
   a conductive layer formed on the second dielectric layer; and
   contacts extending through the conductive layer and the second dielectric layer and electrically contacting the connection pads, respectively.

5. The integrated circuit according to claim 1, wherein the trench conductors comprise a bottom forming undulations presenting shallow portions between the trench isolations and portions reaching the isolation layer, between the shallow portions.

6. The integrated circuit according to claim 1, wherein the connection pads present a width greater than a width of the trench conductors.

7. An electronic device, comprising:
   a memory that includes plural memory cells in a semiconductor substrate, each memory cell including a vertical gate transistor and a charge accumulation transistor, the substrate including a doped isolation layer forming a source region of the vertical gate transistors, the memory including:
   parallel trench isolations formed in the substrate;
   trench conductors formed perpendicularly to the trench isolations, and reaching the isolation layer, the trench conductors forming vertical gates of the vertical gate transistors;
   first dielectric layers respectively isolating the trench conductors from the substrate;
   first doped regions implanted on opposite sides of the trench isolations, and forming drain regions of the transistors; and
   gate connection pads, each extending between an extremity of a respective one of the trench conductors and an edge of the substrate, with an electrical continuity zone between the connection pad and the respective trench conductor;
   conductive lines forming control gates of the charge accumulation transistors and control gate interconnection lines; and
   second doped regions forming drain regions of the charge accumulation transistors, the first doped regions also forming source regions of the charge accumulation transistors.

8. The electronic device according to claim 7, wherein each charge accumulation transistor includes:
   a floating gate;
   a second dielectric layer that isolates the floating gate of the charge accumulation transistor from the substrate; and
   a third dielectric layer that isolates the control gate of the charge accumulation transistor from floating gate of the charge accumulation transistor.

9. The electronic device according to claim 7, comprising:
   a second dielectric layer formed on the connection pads;
   a conductive layer formed on the second dielectric layer; and
   contacts extending through the conductive layer and the second dielectric layer and electrically contacting the connection pads, respectively.

10. The electronic device according to claim 7, wherein the trench conductors comprise a bottom forming undulations presenting shallow portions between the trench isolations and portions reaching the isolation layer, between the shallow portions.

11. The electronic device according to claim 7, wherein the connection pads present a width greater than a width of the trench conductors.

12. The electronic device according to claim 7, further comprising a processor and a communication interface circuit that are coupled to the memory.

13. A method of forming an integrated circuit, the method comprising:
- forming vertical gate transistors in a semiconductor substrate;
- forming a doped isolation layer implanted in the substrate and forming a source region of the transistors;
- forming parallel trench isolations;
- forming trench conductors formed perpendicularly to the trench isolations, and reaching the isolation layer, the trench conductors forming vertical gates of the transistors;
- forming first dielectric layers respectively isolating the trench conductors from the substrate;
- forming first doped regions implanted on opposite sides of the trench isolations, and forming drain regions of the transistors; and
- forming gate connection pads, each extending between an extremity of a respective one of the trench conductors and an edge of the substrate, with an electrical continuity zone between the connection pad and the respective trench conductor.

14. The method according to claim 13, wherein forming the trench conductors and the gate connection pads include:
- depositing a first conductive layer on the first dielectric layer and in the trenches, the first conductive layer being isolated from the substrate by the first dielectric layer;
- etching the second conductive layer, the etching forming the trench conductors in the trenches and the gate connection pads.

15. The method according to claim 14, comprising:
- depositing, on the first conductive layer, a second dielectric layer and a second conductive layer, the second dielectric layer and the second conductive layer being etched with the first conductive layer to form the trench conductors and the gate connection pads;
- etching portions of the connection pads by removing portions of the second conductive layer and the second isolating layer, thereby forming openings in the connection pads; and
- forming contacts on the first conductive layer in of the openings in the connection pads.

16. The method according to claim 15, wherein etching the first conductive layer, the second isolating layer, and the second conductive layer forms at the surface of substrate and parallel to the trenches:
- floating gates and control gates of charge accumulation transistors, each charge accumulation transistor forming a memory cell with a respective one of the vertical gate transistors; and
- conductive lines interconnecting the control gates, wherein implanting the doped regions includes forming drain and source regions of the charge accumulation transistors.

17. The method according to claim 16, wherein the floating gates, the control gates, and the conductive lines extend parallel to the trenches on the surface of the substrate, with two of the conductive lines per trench conductor, one of the two of the conductive lines being left of the trench conductor, and another of the two of the conductive lines being to the right of the trench conductor.

18. The method according to claim 13, wherein forming the trenches includes selectively etching dielectric material of the trench isolation structures and selectively etching semiconductor material of the substrate between and below the trench isolations, in order to provide each of the trenches with a bottom having undulations that include shallower portions between the trench isolations, separated by portions reaching the isolation layer under the etched portions of the trench isolations.

* * * * *